United States Patent [19]
Osaka

[11] Patent Number: 5,434,887
[45] Date of Patent: Jul. 18, 1995

[54] QUADRATURE MODULATION CIRCUIT FOR USE IN A RADIO TRANSMITTER

[75] Inventor: Masahiko Osaka, Tokyo, Japan

[73] Assignee: NEC Corporation, Tokyo, Japan

[21] Appl. No.: 109,921

[22] Filed: Aug. 23, 1993

[30] Foreign Application Priority Data

Aug. 25, 1992 [JP] Japan .................. 4-225472

[51] Int. Cl.$^6$ ...................... H04L 27/04; H04L 27/20
[52] U.S. Cl. .................. 375/295; 375/308; 332/103; 331/46
[58] Field of Search .............. 375/59, 39, 52, 54, 375/67, 66; 455/119, 76; 332/103, 126, 104, 105; 331/2, 18, 37, 46

[56]     References Cited
U.S. PATENT DOCUMENTS

| 3,031,527 | 4/1962 | Barton et al. | 375/66 |
| 4,259,744 | 3/1981 | Junod et al. | 455/119 |
| 4,395,776 | 7/1983 | Naito et al. | 455/76 |
| 4,882,552 | 11/1989 | Harris | 375/66 |
| 5,065,408 | 11/1991 | Gillig | 455/76 |
| 5,073,973 | 12/1991 | Ylivakeri | 455/76 |

FOREIGN PATENT DOCUMENTS 62-94170  4/1987  Japan .................. 375/39
1117141   8/1989  Japan .

OTHER PUBLICATIONS

"McGraw-Hill Dictionary of Scientific and Technical Terms", second edition, 1978.

Primary Examiner—Stephen Chin
Assistant Examiner—Tesfaldet Bocure
Attorney, Agent, or Firm—Young & Thompson

[57]     ABSTRACT

A quadrature modulation circuit is comprised of two frequency generators which generate a first frequency signal and a second frequency signal, respectively, and a mixer which mixes the first frequency signal and the second frequency signal to generate the carrier wave whose frequency is different from both the first frequency and the second frequency. By the quadrature modulation of this carrier wave according to a baseband signal, a transmission wave can be obtained. Since the first frequency differs from the carrier frequency and the second frequency differs from both the carrier frequency and the first frequency, the output signals of the frequency generators are not affected by the transmission wave.

13 Claims, 7 Drawing Sheets

FIG. 1

(PRIOR ART)

QUADRATURE MODULATION CIRCUIT FOR USE IN A RADIO TRANSMITTER

FIELD OF THE INVENTION

The present invention relates to a modulation circuit for modulating a carrier wave according to a digital signal and, in particular, to a quadrature modulation circuit used in a radio transmitter or the like.

BACKGROUND OF THE INVENTION

In Phase Shift Keying (PSK), orthogonal BPSK (Binary PSK) waves can be synthesized to obtain a QPSK (Quadriphase PSK) wave having excellent noise margin and a large capacity of transmitted information. Also, in Amplitude Shift Keying (ASK), the orthogonal components can be synthesized to obtain a QAM (Quadrature Amplitude Modulation) wave, in particular, a 16 QAM wave which is currently widely used.

Figure 1:
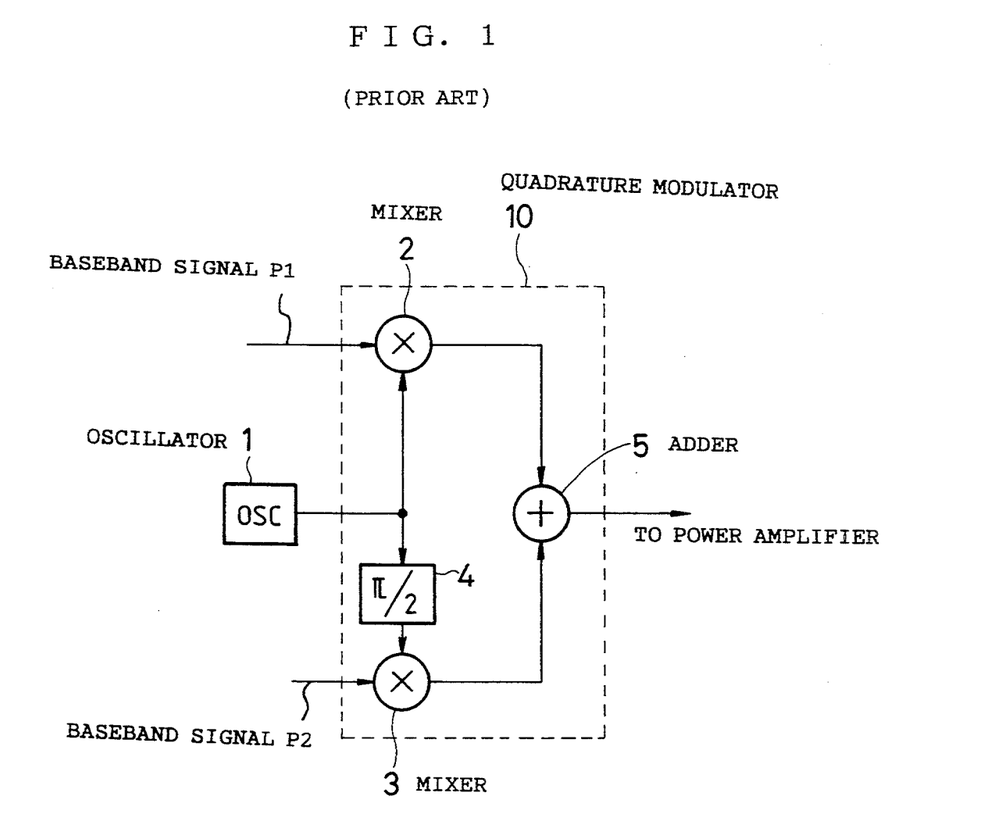
FIG. 1 is a block diagram of a conventional quadrature modulation circuit.

A general arrangement of such a quadrature modulation circuit is illustrated in FIG. 1. The carrier frequency wave generated by an oscillator 1 is input to a mixer 2 which mixes the carrier frequency wave and a baseband signal P1. The carrier frequency wave is also input through a 90° phase shifter 4 to a mixer 3 which mixes a baseband signal P2 and the carrier frequency wave whose phase has been shifted by 90°. The respective mixed waves output from the mixers 2 and 3 are added in an adder 5 to be fed out to a power amplifier (not shown) as a modulated carrier wave (e.g. a QPSK wave).

In this conventional quadrature modulation circuit, the carrier frequency wave from the oscillator 1 is modulated according to the baseband waves P1 and P2 to obtain a modulated carrier wave for transmission. This modulated carrier wave, however, is shifted in frequency over a certain bandwidth, and further this frequency shift is very close to the carrier frequency. Therefore, if the modulated carrier wave for transmission is amplified in power, then part of the amplified carrier wave is leaked back to the oscillator 1 to deteriorate the stability of the transmission carrier wave. In particular, in the case of a portable radio transmitter, since it is difficult to isolate the oscillator which generates the carrier frequency wave from the power amplifier which amplifies the transmission wave, the stability of the transmission wave is remarkably degraded.

It is an object of the present invention to provide a quadrature modulation circuit which allows the stability of the transmission wave to be improved with a simple structure.

SUMMARY OF THE INVENTION

A quadrature modulation circuit according to the present invention is comprised of two frequency generators which generate a first frequency signal and a second frequency signal, respectively, and a mixer which mixes the first frequency signal and the second frequency signal to generate the carrier wave whose frequency is different from both the first frequency and the second frequency. By the quadrature modulation of this carrier wave according to the baseband signal, a transmission wave can be obtained. Since the first frequency differs from the carrier frequency and the second frequency differs from both the carrier frequency and the first frequency, the output signals of the frequency generators are not affected by the transmission wave, resulting in stable modulation.

The frequency generators may be comprised of two oscillators which can generate the first frequency and the second frequency, respectively. A phase-locked loop circuit may be employed for generating the first frequency and/or the second frequency signals in synchronization with the reference signal generated by a reference oscillator. The phase-locked loop circuit is comprised of a frequency divider which divides the output frequency of a voltage controlled oscillator, and a phase comparator which compares the output signal of the divider with the reference signal in phase to output a voltage corresponding to the phase difference to the voltage controlled oscillator as a control voltage. A frequency synthesizer may be employed as a frequency generator. The frequency synthesizer can be realized by using the frequency divider which can change its dividing ratio.

DESCRIPTION OF THE PREFERRED EMBODIMENTS

Figure 2:
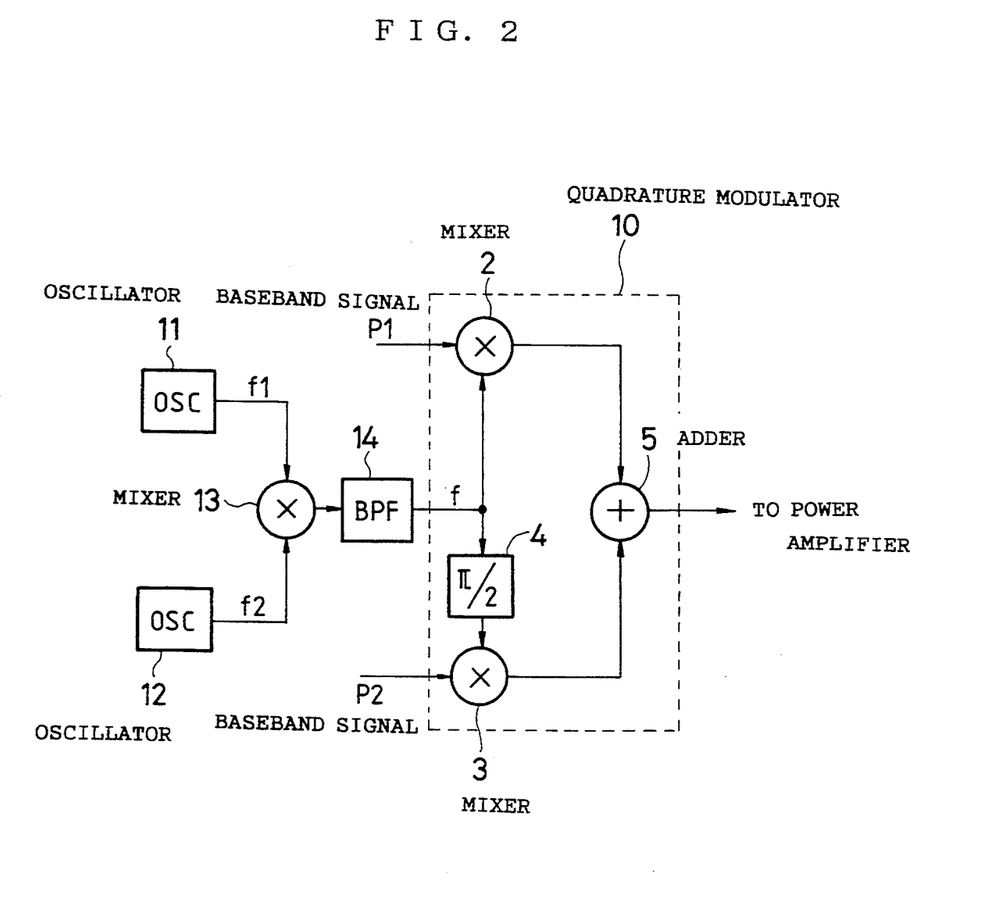
FIG. 2 is a block diagram of the quadrature modulation circuit according to a first embodiment of the present invention.

In the first embodiment according to the present invention, as shown in FIG. 2, an oscillator 11 outputs an oscillation wave of frequency f1, and an oscillator 12 outputs an oscillation wave of frequency f2 which is different from the frequency f1 of the oscillator 11. Those oscillation waves are mixed by a mixer 13. From the output wave of the mixer 13, the carrier wave of frequency f is extracted by a band pass filter 14 and is entered to the quadrature modulator 10. The frequency f of the carrier wave differs from each oscillation frequency of the oscillators 11 and 12.

In the quadrature modulator 10, the carrier wave is entered to the mixer 2 to be mixed with the baseband signal P1, and is also shifted by a phase angle of 90° by the phase shifter 4. The phase-shifted carrier wave is input to the mixer 3 to be mixed with the baseband signal P2. If the quadrature modulator 10 is a QPSK modulator, the mixer 2 modulates the carrier wave according to the baseband signal P1 to output a BPSK wave while the mixer 3 modulates the phase-shifted carrier wave according to the baseband signal P2 to output a BPSK wave. The adder 5 adds the orthogonal BPSK waves to generate a QPSK wave which is output to the power amplifier (not shown).

Figure 3:
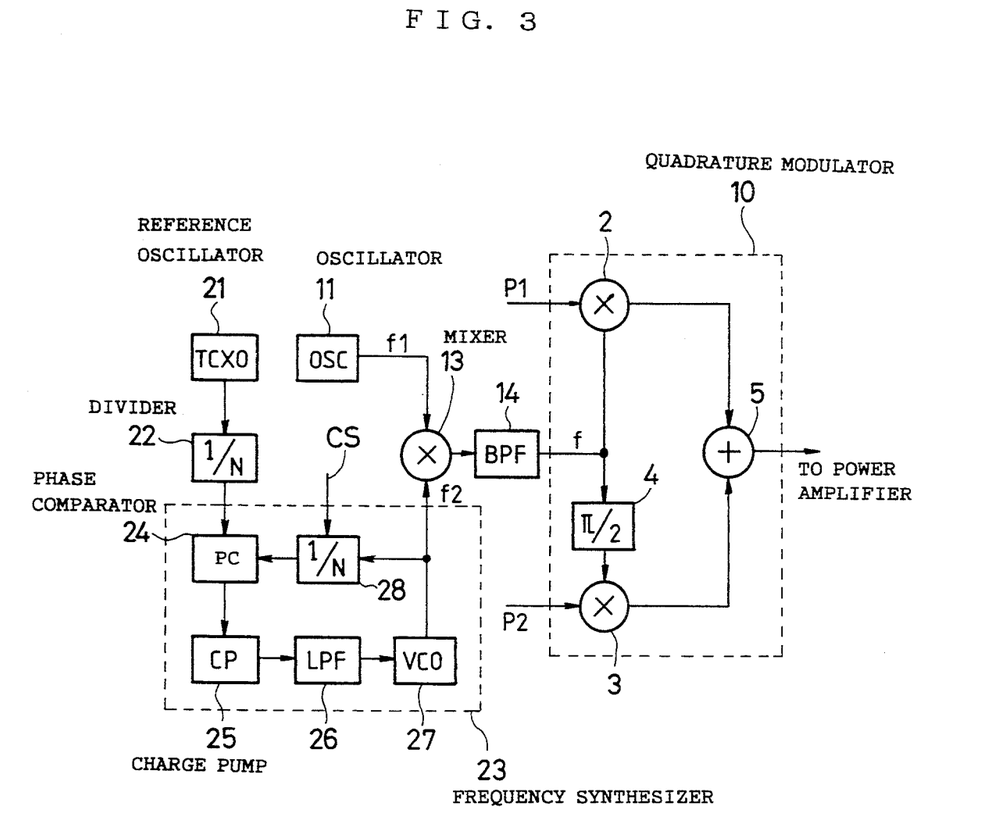
FIG. 3 is a block diagram of the quadrature modulation circuit according to a second embodiment of the present invention.

In the second embodiment of the present invention, as shown in FIG. 3, the output frequency of a reference oscillator 21 is divided into 1/N by a frequency divider 22 and, in synchronization with that frequency-divided signal, a frequency synthesizer 23 generates the signal of frequency f2.

In the frequency synthesizer 23, the dividing ratio 1/N of the frequency divider 28 is changed according to a control signal CS. The output frequency of a voltage controlled oscillator 27 is divided according to the dividing ratio of the divider 28 to enter to a phase comparator 24. The phase difference between the output signals of the frequency dividers 22 and 28 is detected by the phase comparator 24, and is converted into the voltage corresponding to the phase difference by means of a charge pump 25. The voltage corresponding to the phase difference is entered as a control voltage to a voltage controlled oscillator 27 via a low pass filter 26. Therefore, the frequency synthesizer 23 can stably generate the signal of frequency f2 synchronizing in phase with the reference wave oscillated by the reference oscillator 21 and yet can change the output frequency f2 by changing the control signal CS.

The output signal (frequency f1) of the oscillator 11 and the output signal (frequency f2) of the frequency synthesizer 23 are mixed by the mixer 13, and the carrier wave having the desired frequency f is extracted through the band pass filter 14. Other arrangements are similar to those of the first embodiment of FIG. 2.

Figure 4:
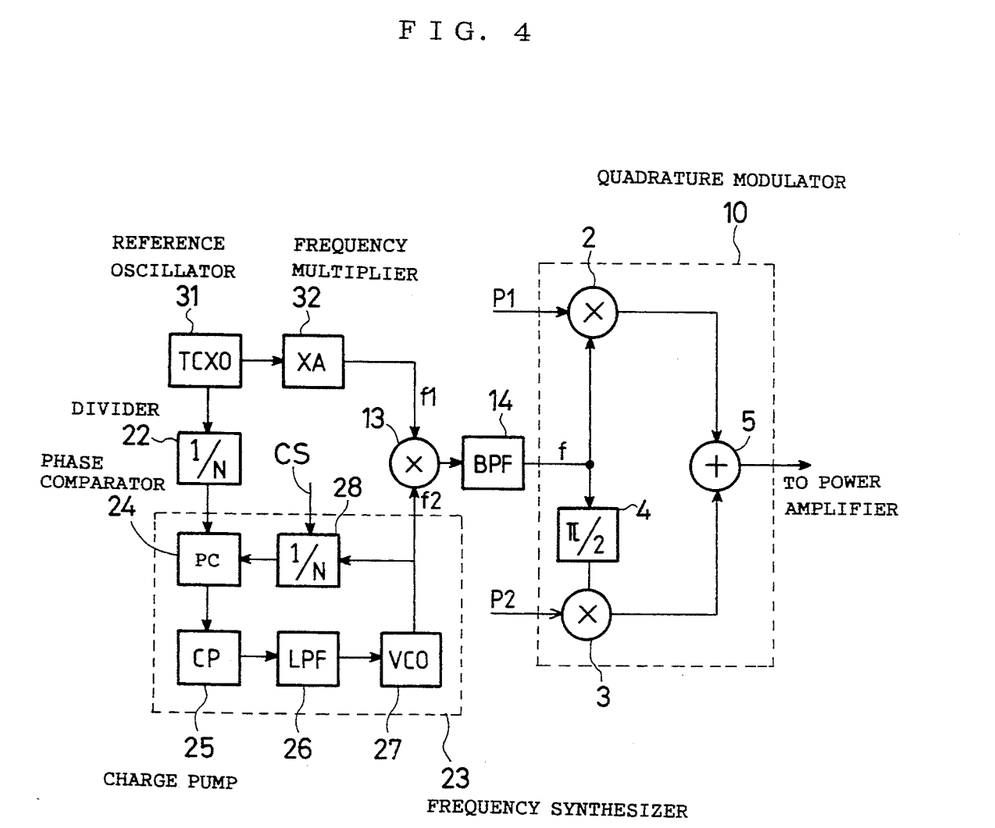
FIG. 4 is a block diagram of the quadrature modulation circuit according to a third embodiment of the present invention.

In the third embodiment of the present invention, as shown in FIG. 4, the output signal of a reference oscillator 31 is multiplied by an integer preset in a frequency multiplier 32 in a manner well known in the art to generate the signal of frequency f1. The reference oscillator 31 is preferably a temperature compensated X'tal oscillator (TCXO). Simultaneously, the output signal of the reference oscillator 31, as in the foregoing second embodiment, is divided in frequency by a frequency divider 22 to be output to the frequency synthesizer 23. In synchronization with that frequency-divided signal the frequency synthesizer 23 generates the signal of frequency f2 which can be changed in frequency by the control signal CS.

Figure 5:
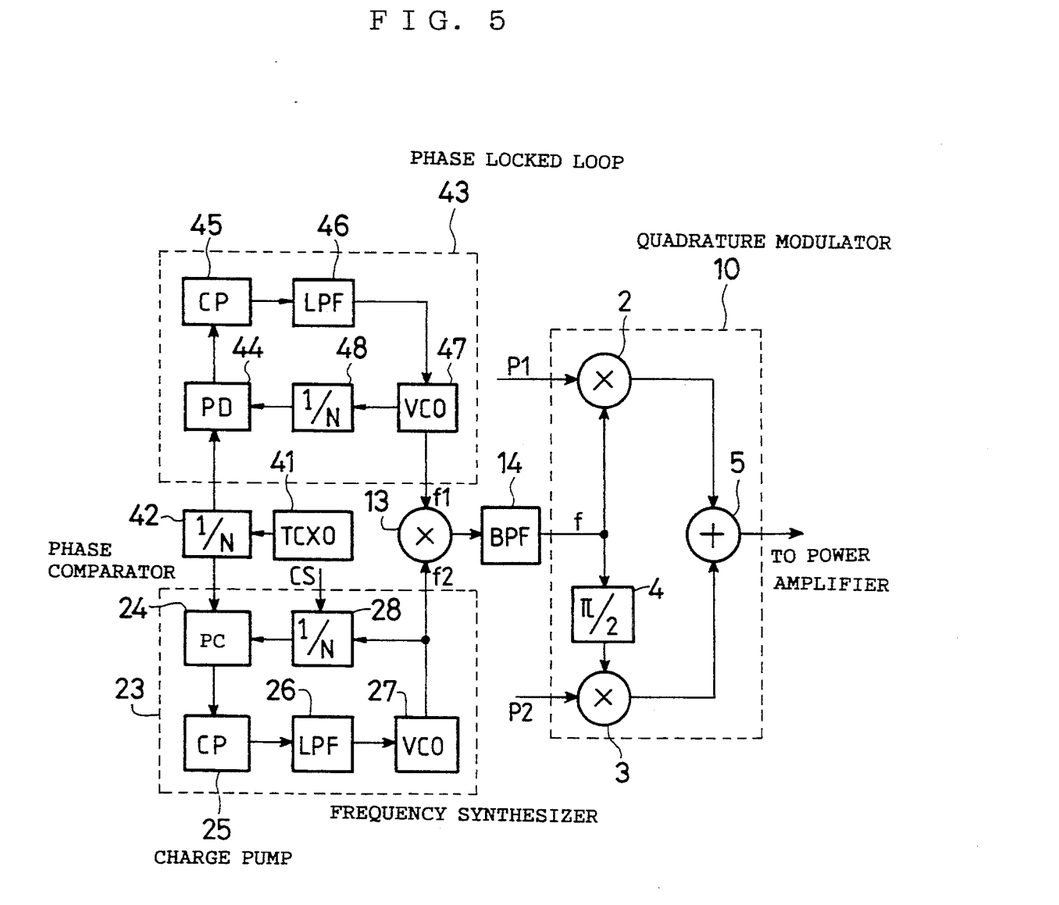
FIG. 5 is a block diagram of the quadrature modulation circuit according to a fourth embodiment of the present invention.

In the fourth embodiment of the present invention, as shown in FIG. 5, the output signal of a reference oscillator 41 is divided in frequency into 1/N by means of a frequency divider 42 and, in synchronization with that frequency-divided signal, the frequency synthesizer 23 generates the signal of frequency f2. Similarly, in synchronization with the signal divided in frequency by the frequency divider 42, a frequency synthesizer 43 generates the signal of frequency f1. The frequency synthesizer 43 is comprised of a phase-locked loop circuit, and has an arrangement similar to that of the frequency synthesizer 23 except that the frequency dividing ratio of the frequency divider 48 is fixed. That is, the phase difference between the output signals of the frequency dividers 42 and 48 is detected by a phase comparator 44, and is converted into the voltage by means of a charge pump 45 to be entered to a voltage controlled oscillator 47 as the control voltage via a low pass filter 46.

Figure 6:
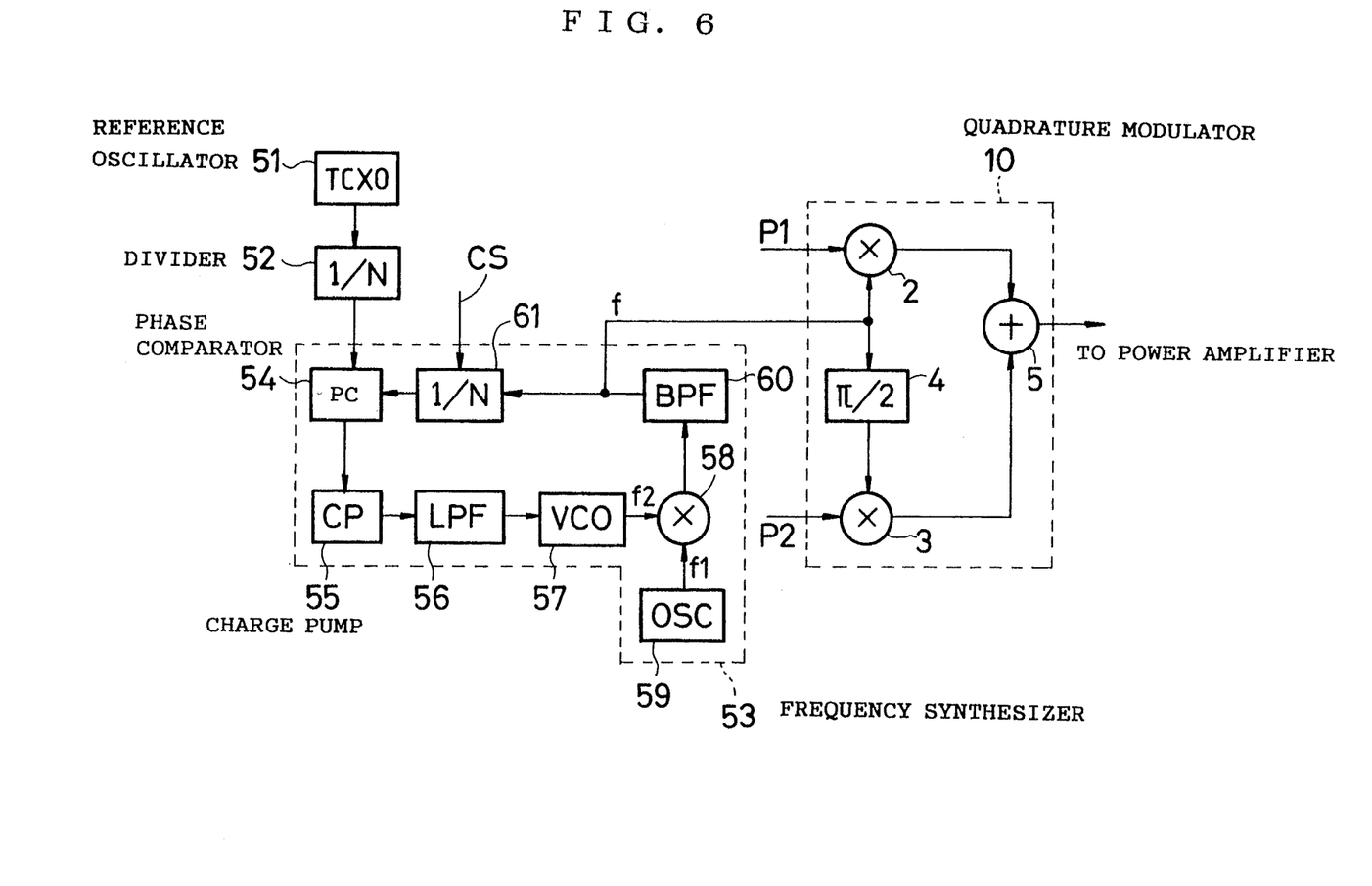
FIG. 6 is a block diagram of the quadrature modulation circuit according to a fifth embodiment of the present invention.

In the fifth embodiment of the present invention, as shown in FIG. 6, the output signal of a reference oscillator 51 is divided in frequency by frequency divider 52 and, in synchronization with the frequency-divided signal, a frequency synthesizer 53 generates the carrier wave of frequency f.

In the frequency synthesizer 53, the output signal (frequency f2) of a voltage controlled oscillator 57 and the output signal (frequency f1) of an oscillator 59 are mixed by a mixer 58 to generate the signal of carrier frequency f through a band pass filter 60. This carrier frequency signal is output to the quadrature modulator 10 as the carrier wave while being output to a frequency divider 61, which may change its frequency dividing ratio 1/N according to the control signal CS. The carrier frequency signal divided in frequency into 1/N by the frequency divider 61 is input to a phase comparator 54. The phase difference between the output signals of the frequency divider 52 and 61 is detected by the phase comparator 54, and is converted into the voltage by a charge pump 55 to input to the voltage controlled oscillator 57 as the control voltage through a low pass filter 56. In this manner, the frequency synthesizer 53 may stably supply the carrier wave of frequency f synchronizing with the phase of the reference oscillator 51 to the quadrature modulator 10. Further, since the carrier wave can be generated with a single frequency synthesizer, its arrangement may be simplified.

Figure 7:
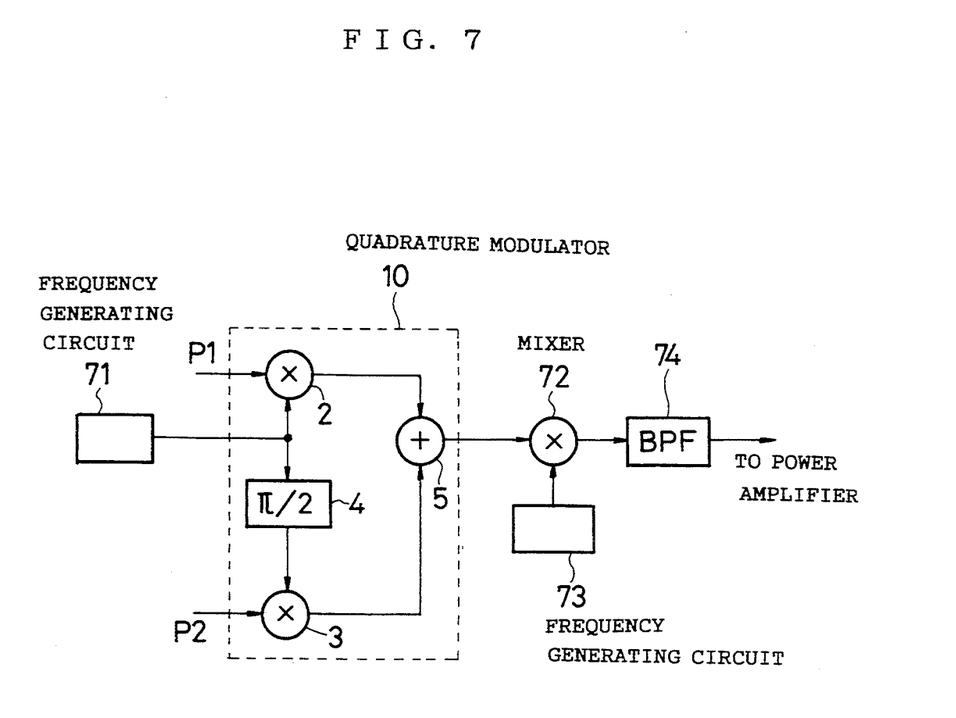
FIG. 7 is a block diagram of the quadrature modulation circuit according to a sixth embodiment of the present invention.

In the sixth embodiment of the present invention, as shown in FIG. 7, the quadrature modulator 10 makes a quadrature modulation of the signal of frequency f1 generated by the frequency generator 71. In a mixer 72, the modulated wave output from the quadrature modulator 10 is mixed with the signal of frequency f2 generated by a frequency generator 73 for frequency conversion, and the modulated wave of frequency f is extracted through a band pass filter 74.

As described above, the quadrature modulation circuit according to the present invention generates two different frequency signals each being different from the carrier frequency, and generates the carrier wave on the basis of the two different frequency signals. Therefore, the influence on the frequency generators which can be caused by the amplified transmission wave, is eliminated, and the stable transmission wave can be obtained. In particular, the present invention is extremely effective for the case in which, as in the portable radio apparatus, it is difficult to isolate the frequency generator for generating the carrier wave from the power amplifier for transmission.

What is claimed is:

1. Quadrature modulation circuit in a radio transmitter comprising:

first generating means for generating a first frequency signal, said first frequency being different from a carrier frequency;

second generating means for generating a second frequency signal, said second frequency being different from both said carrier frequency and said first frequency;

carrier generating means for generating a carrier signal of said carrier frequency on the basis of said first frequency signal and said second frequency signal; and modulating means for performing a quadrature modulation of said carrier signal generated by said carrier generating means according to a baseband signal.

2. Quadrature modulation circuit as set forth in claim 1, wherein said first generating means is comprised of: a reference oscillator for generating a reference signal; and a phase-locked loop circuit for generating said first frequency signal in synchronization with said reference signal.

3. Quadrature modulation circuit as set forth in claim 2, wherein said phase-locked loop circuit is comprised of:
- a voltage controlled oscillator for generating said first frequency signal, said oscillator being capable of controlling its output frequency according to a control voltage;
- a divider for dividing said output frequency of said voltage controlled oscillator; and
- a phase comparing circuit for comparing the phases of said reference signal and the output signal of said divider to provide said voltage controlled oscillator with said control voltage corresponding to the phase difference between said reference signal and said output signal of said divider.

4. Quadrature modulation circuit as set forth in claim 3, wherein said divider is capable of changing its dividing ratio.

5. Quadrature modulation circuit as set forth in claim 1, wherein said quadrature modulation circuit is further comprised of a reference oscillator for generating a reference signal,
- said first generating means comprising a first phase-locked loop circuit for generating said first frequency signal in synchronization with said reference signal, and
- said second generating means comprising a second phase-locked loop circuit for generating said second frequency signal in synchronization with said reference signal.

6. Quadrature modulation circuit as set forth in claim 5, wherein
- said first phase-locked loop circuit is comprised of: a first voltage controlled oscillator for generating said first frequency signal, said first oscillator being capable of controlling its output frequency according to a first control voltage; a first divider for dividing said output frequency of said first voltage controlled oscillator; and a first phase comparing circuit for comparing the phases of said reference signal and the output signal of said first divider to provide said first voltage controlled oscillator with said first control voltage corresponding to the phase difference between said reference signal and said output signal of said first divider, and
- said second phase-locked loop circuit is comprised of: a second voltage controlled oscillator for generating said second frequency signal, said second oscillator being capable of controlling its output frequency according to a second control voltage; a second divider for dividing said output frequency of said second voltage controlled oscillator; and a second phase comparing circuit for comparing the phases of said reference signal and the output signal of said second divider to provide said second voltage controlled oscillator with said second control voltage corresponding to the phase difference between said reference signal and said output signal of said second divider.

7. Quadrature modulation circuit as set forth in claim 6, wherein said second divider is capable of changing its dividing ratio.

8. Quadrature modulation circuit as set forth in claim 1, wherein said quadrature modulation circuit is further comprised of a reference oscillator for generating a reference signal,
- said first generating means comprising a frequency multiplier for multiplying the frequency of said reference signal by a predetermined integer number to generate said first frequency signal; and
- said second generating means comprising a phase-locked loop circuit for generating said second frequency signal in synchronization with said reference signal.

9. Quadrature modulation circuit as set forth in claim 8, wherein said phase-locked loop circuit is comprised of:
- a voltage controlled oscillator for generating said second frequency signal, said oscillator being capable of controlling its output frequency according to a control voltage;
- a divider for dividing said output frequency of said voltage controlled oscillator; and
- a phase comparing circuit for comparing the phases of said reference signal and the output signal of said divider to provide said voltage controlled oscillator with said control voltage corresponding to the phase difference between said reference signal and said output signal of said divider.

10. Quadrature modulation circuit as set forth in claim 9, wherein said divider is capable of changing its dividing ratio.

11. Quadrature modulation circuit in a radio transmitter comprising:
- a reference oscillator for generating a reference signal having a predetermined frequency;
- a first oscillator for generating a first frequency signal which is different from a carrier signal in frequency, said first oscillator being capable of changing said first frequency according to a control voltage;
- a second oscillator for generating a second frequency signal, said second frequency being different from both said carrier frequency and said first frequency;
- a carrier generator for generating said carrier signal on the basis of said first frequency signal and said second frequency signal;
- a divider for dividing the output frequency of said carrier generator;
- a phase comparing circuit for comparing the phases of said reference signal and the output signal of said divider to provide said first oscillator with said control voltage corresponding to the phase difference between said reference signal and said output signal of said divider; and
- modulating means for performing a quadrature modulation of said carrier signal generated by said carrier generator according to a baseband signal.

12. Quadrature modulation circuit as set forth in claim 11, wherein said divider is capable of changing its dividing ratio.

13. Quadrature modulation circuit in a radio transmitter comprising:
- first generating means for generating a first frequency signal, said first frequency being different from a carrier frequency;
- second generating means for generating a second frequency signal, said second frequency being different from both said carrier frequency and said first frequency;
- carrier generating means for generating a carrier signal of said carrier frequency on the basis of said first frequency signal and said second frequency signal;

first mixing means for mixing said carrier signal and a first baseband signal;

phase shifting means for shifting the phase of said carrier signal by 90°;

second mixing means for mixing said phase-shifted carrier signal and a second baseband signal; and adding means for adding the output signal of said first mixing means and the output signal of said second mixing means to generate a modulated carrier signal.

* * * * *